United States Patent
Brist et al.

(10) Patent No.: US 7,043,706 B2
(45) Date of Patent: May 9, 2006

(54) CONDUCTOR TRACE DESIGN TO REDUCE COMMON MODE CROSS-TALK AND TIMING SKEW

(75) Inventors: Gary A. Brist, Yamhill, OR (US);
Gary B. Long, Aloha, OR (US);
William O. Alger, Portland, OR (US);
Carlos Mejia, Portland, OR (US);
Bryce Horine, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 503 days.

(21) Appl. No.: 10/387,291

(22) Filed: Mar. 11, 2003

(65) Prior Publication Data

US 2004/0181764 A1    Sep. 16, 2004

(51) Int. Cl.
*G06F 17/50*   (2006.01)

(52) U.S. Cl. ............................................. 716/6; 716/15
(58) Field of Classification Search ................. 716/6, 716/15

See application file for complete search history.

(56) References Cited

U.S. PATENT DOCUMENTS 6,304,700 B1   10/2001   Brand et al.
2004/0262036 A1 *  12/2004   Brist et al. .................. 174/261

FOREIGN PATENT DOCUMENTS

JP        2001354754 A  *  12/2001
JP        2004158354 A  *  6/2004

* cited by examiner

*Primary Examiner*—Stacy A. Whitmore
(74) *Attorney, Agent, or Firm*—Blakely, Sokoloff, Taylor & Zafman LLP

(57) ABSTRACT

A method and apparatus for reducing timing skew between conductor traces. A dielectric medium made of a resin reinforced with a fabric is provided. The fabric includes a first plurality of yarns running parallel to a first axis and a second plurality of yarns running parallel to a second axis. The first plurality of yarns are separated by a first weave pitch and the second plurality of yarns separated by a second weave pitch. At least two conductor traces are formed on the dielectric medium. The conductor traces are positioned on the dielectric medium such that the conductor traces each have substantially similar effective dielectric constants.

23 Claims, 8 Drawing Sheets

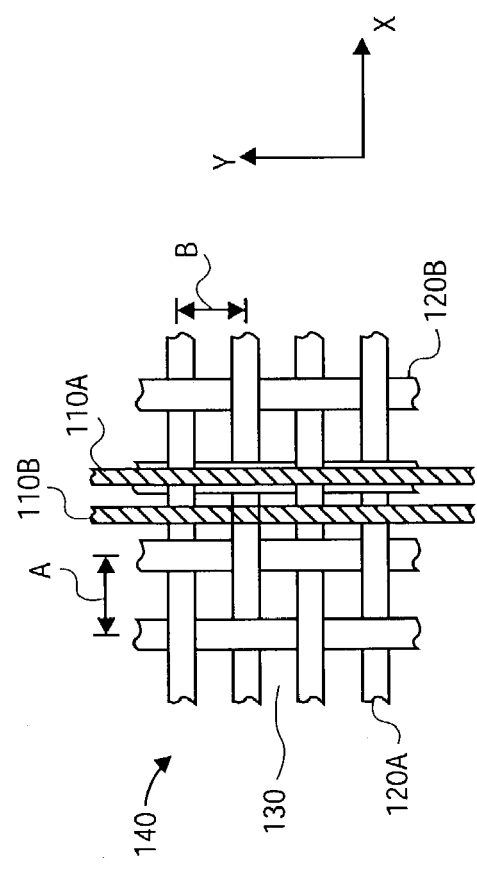
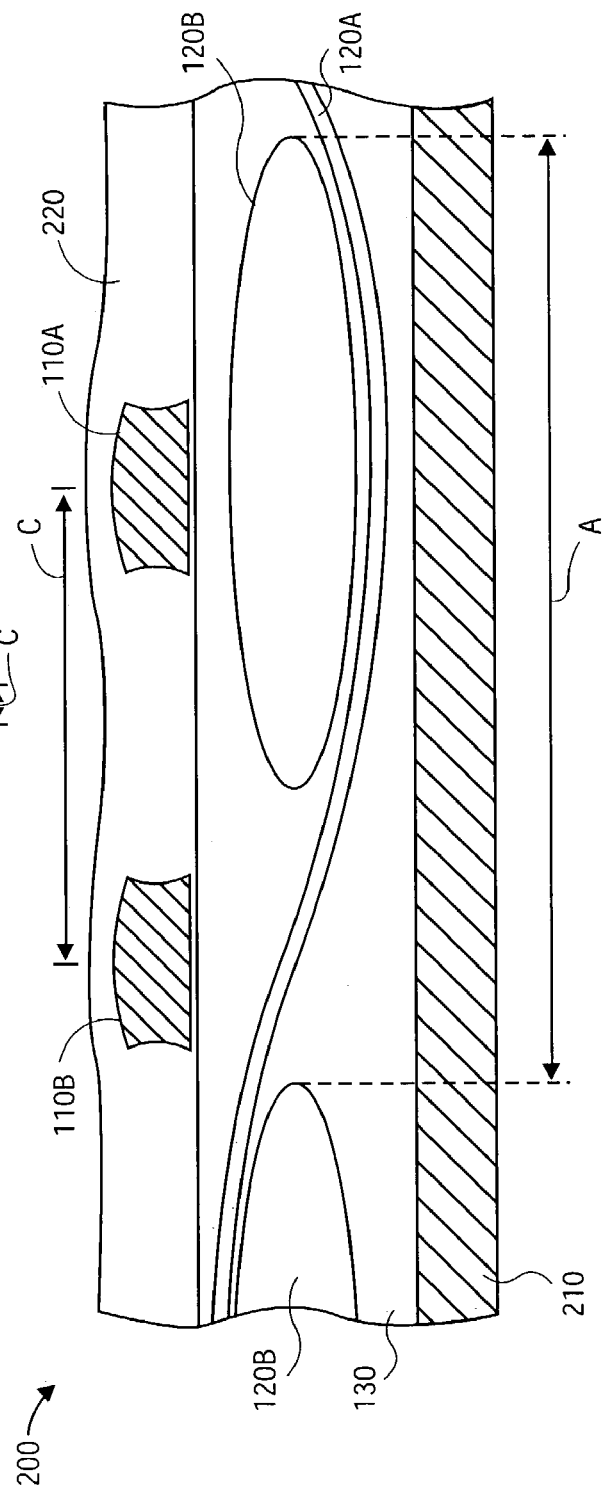

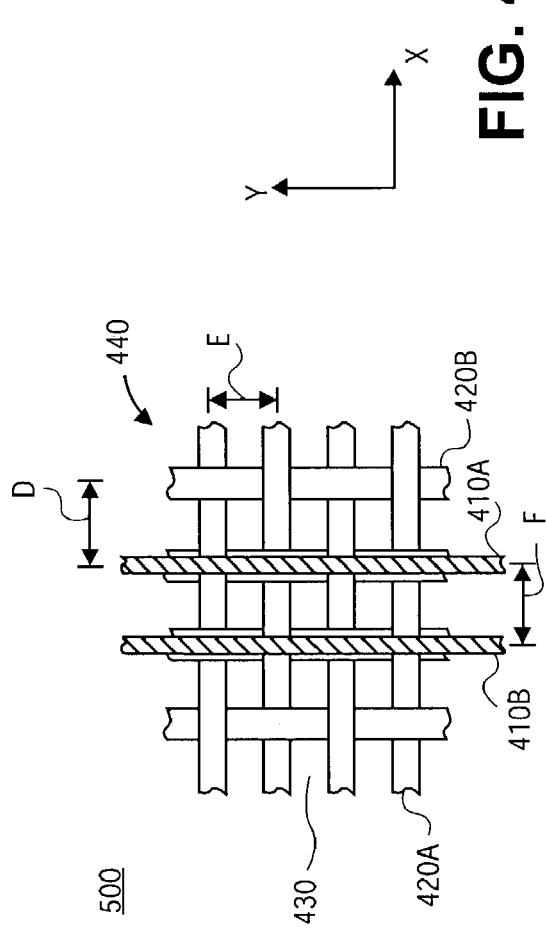
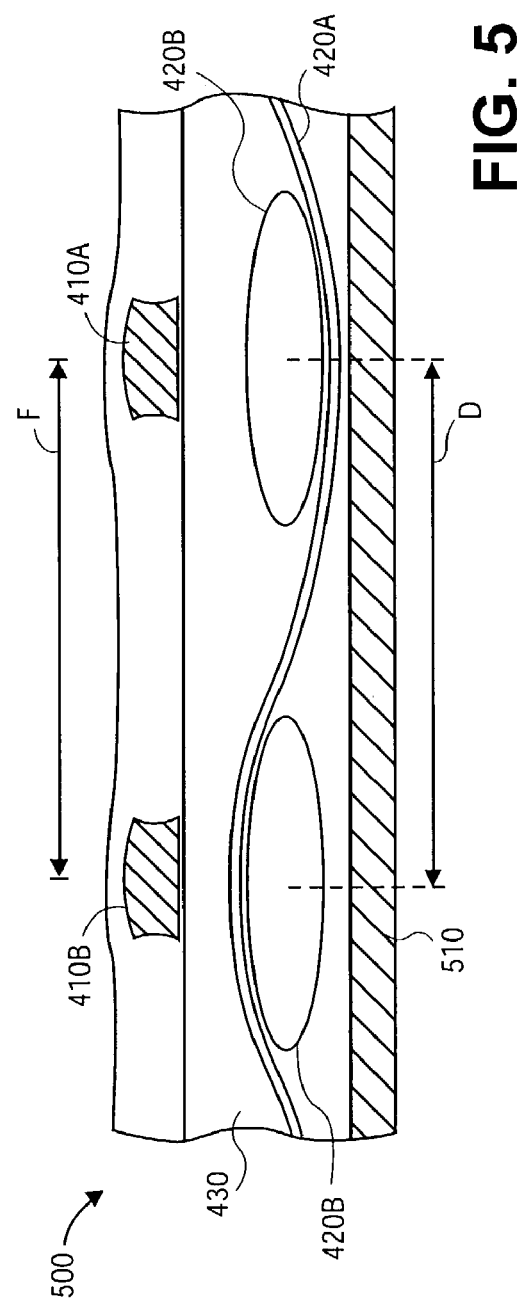

CONDUCTOR TRACE DESIGN TO REDUCE COMMON MODE CROSS-TALK AND TIMING SKEW

TECHNICAL FIELD

This disclosure relates generally to conductor trace design, and in particular but not exclusively, relates to spatially orientating conductor traces on a circuit board to minimize common mode cross-talk and/or timing skew.

BACKGROUND INFORMATION

Today, printed circuit boards ("PCBs") are designed using computer aided design ("CAD") tools. These CAD tools allow the designer to plan a circuit board design, including components mounted thereon and the interconnecting conductor traces, within a computer environment. Once a design is finalized after testing and optimization, the CAD tool outputs an image of the design. This image is used to etch the conductor traces onto the surface of the PCB.

PCBs are used as a substrate to support electronic components mounted thereon (e.g., surface mount components) and the conductor traces that interconnect these electronic components. Typical PCBs are constructed with an epoxy resin reinforced with a single layer of woven fiberglass fabric suspended therein. This epoxy resin and fiberglass composite forms a rigid insulating dielectric medium less than ideal for depositing electronic components and conductor traces thereon.

One drawback of a composite PCB is localized variations in its dielectric constant. The constituents of a composite PCB—epoxy resin and fiberglass fabric—have differing dielectric constants. When an electric field passes through a dielectric medium, it causes microscope distortions in its charge distribution by inducing dipoles and polarizing bound charges. These distortions in turn affect other electric properties of the dielectric medium. These distortions in a PCB are generally undesirable, but are particularly undesirable if not uniform throughout the PCB.

Since the typical PCB discussed above is a composite of epoxy resin and fiberglass fabric having differing dielectric constants, localized dielectric constants vary throughout the PCB. Thus, electric signals transmitted on conductor traces running across the surface of a composite PCB will experience varying effective dielectric constants. The cumulated effect of this varying dielectric constant results in detrimental timing skew. Thus, if two conductor traces running side by side are conducting signals across the PCB, the varying dielectric constant may cause one signal to arrive earlier than the other. When the receipt of these signals is time critical, this timing skew will deleteriously constrain component clock speeds and bandwidth.

Differences between the effective dielectric constant experienced by adjacent conductor traces running over an epoxy resin and fiberglass fabric composite have been measured as high as 0.3, which can limit conductor traces of 6–10 inches to a maximum frequency of 5–10 GHz. Currently, the problem of varying effective dielectric constants is addressed a number of different ways, including: adding multiple fiberglass fabric and resin layers to even out localized variations in the dielectric constant, shrinking feature sizes to limit conductor trace exposure to localized variations in the dielectric constant, and/or utilization of specialty composite materials having less divergent dielectric constants. However, all of these methods increase design complexity, fabrication costs, or both.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 1 is a top view illustrating a pair of conductor traces on a circuit board having a center-to-center separation distance not matching a weave pitch separating adjacent yarns in the circuit board.

FIG. 2 is a cross-sectional view illustrating the circuit board including the pair of conductor traces having the center-to-center separation distance not matching the weave pitch separating the adjacent yarns in the circuit board.

FIG. 4 is a top view illustrating a pair of conductor traces on a circuit board having a center-to-center separation distance matching a weave pitch separating adjacent yarns in the circuit board, in accordance with an embodiment of the present invention.

FIG. 5 is a cross-sectional view illustrating the circuit board including the pair of conductor traces having the center-to-center separation distance matching the weave pitch separating adjacent yarns in the circuit board, in accordance with an embodiment of the present invention.

DETAILED DESCRIPTION

Figure 3:
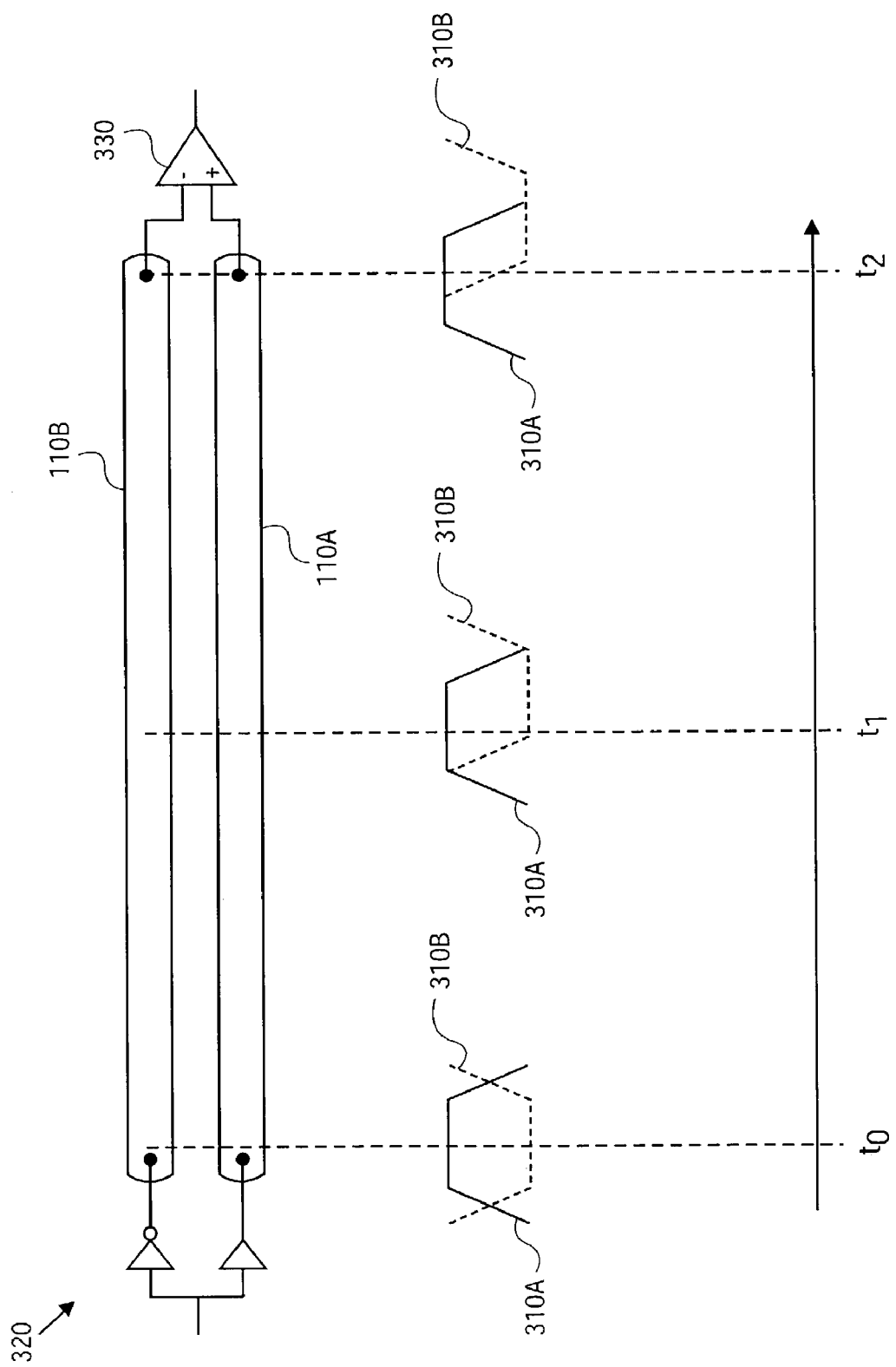
FIG. 3 is a block diagram illustrating timing skew resulting from the pair of conductor traces having the center-to-center separation distance different than the weave pitch separating the adjacent yarns underlying the pair of conductor traces.

Embodiments of an apparatus and method for minimizing common mode cross-talk and timing skew between conductor traces are described herein. In the following description numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In embodiments of the present invention, timing skew between two or more conductor traces is reduced by appropriate orientation and/or spacing between the conductor traces. In one embodiment, this spacing is equal to integer multiples of a weave pitch between yarns of a circuit board. In one embodiment, when the weave pitch is unknown or it is unpractical due to design constraints to match the weave pitch, the conductor traces are routed along a "zigzag" path to average out localized variations in the dielectric constant of the circuit board. In one embodiment, timing skew is reduced between the conductor traces by routing them along a "snake-like" path to average out localized variations in the dielectric constant of the circuit board. In one embodiment, timing skew between conductor traces is reduced by constraining their widths to integer multiples of a weave pitch. In one embodiment, timing skew between two or more conductor traces is reduced by rotating a design layout relative to yarns in the circuit board.

FIG. 1 is a top view illustrating a pair of conductor traces 110A and 110B routed on a circuit board 200 (FIG. 2). In this embodiment, circuit board 200 includes x-axis yarns 120A and y-axis yarns 120B woven into a fabric 140 suspended in a solidified resin 130. In one embodiment, each of yarns 120A and yarns 120B are bundles of glass fibers. Yarns 120A and 120B are subsequently weaved together to form fabric 140. In one embodiment, fabric 140 is a fiberglass cloth. In one embodiment, resin 130 is an epoxy resin.

As can be seen by FIG. 1, fabric 140 has a weave pitch A that represents a center-to-center separation distance between adjacent y-axis yarns 120B and a weave pitch B that represents a center-to-center separation distance between adjacent x-axis yarns 120A. In one embodiment, weave pitch A and weave pitch B are substantially identical, thus forming a square weave pattern. In an alternative embodiment, weave pitch A and weave pitch B are substantially different, thus forming a rectangular weave pattern.

In the illustrated embodiment, conductor trace 110A is formed on circuit board 200 such that conductor trace 110A runs directly above and parallel with an individual yarn 120B. Similarly, conductor trace 110B is formed on the surface of circuit board 200 and runs parallel to conductor trace 110A, but runs between adjacent yarns 120B. Thus, conductor traces 110A and 110B have a conductor trace pitch C (i.e., center-to-center separation distance) less than weave pitch A.

FIG. 2 is a cross-sectional view illustrating circuit board 200 including conductor traces 110A and 110B. In this embodiment, circuit board 200 further includes fabric 140 having yarns 120A and yarns 120B, resin 130, and ground plane 210. Embodiments of circuit board 200 can include more layers above and below those illustrated in FIG. 2, but have been excluded for the sake of clarity. Conductor traces 110A and 110B and ground plane 210 are made of any conducting material, metal, metal alloy, or the like. In one embodiment, conductor traces 110A and 110B and ground plane 210 are copper.

As mentioned above, and illustrated in FIGS. 1 and 2, conductor trace 110A is formed above one of yarns 120B, while conductor trace 110A is formed above a portion of circuit board 200 primarily made of resin 130 between adjacent yarns 120B. This unmatched orientation of conductor traces 110A and 110B to yarns 120B causes conductor trace 110A to have a higher effective dielectric constant than that of conductor trace 110B. This difference in effective dielectric constants is a result of the non-homogenous laminate composition of circuit board 200. In general, depending upon the constituent materials, yarns 120A and 120B have a higher dielectric constant then resin 130. An electric signal propagating along conductor trace 110A induces an electromagnetic field that encircles conductor trace 110A. Thus, a substantial portion of this electromagnetic field resides within yarn 120B for the full length of conductor trace 110A. Similarly, an electric signal traveling along conductor trace 110B induces an encircling electromagnetic field. However, a substantial portion of this field resides in resin 130. Only the portions of conductor trace 110B that crossover yarns 120A will result in a large portion of the electromagnetic field from conductor trace 110B residing in yarns 120A. Thus, a signal propagating along conductor trace 110A will experience a higher effective dielectric constant.

FIG. 3 illustrates timing skew that results from the orientation of conductor traces 110A and 110B with respect to yarns 120A and 120B, in FIGS. 1 and 2. Waveform 310A represents a signal propagating along conductor trace 110A and waveform 310B represents a signal propagating along conductor trace 110B. Waveforms 310A and 310B are generated by driver 320 at time $t_0$ and launched simultaneously onto conductor traces 110A and 110B, respectively. At time $t_1$ it can be seen that waveform 310A is propagating at a slower speed than waveform 310B. At time $t_2$, waveform 310A arrives at receiver 330. However, due to the lower effective dielectric constant experienced by waveform 310B propagating along conductor trace 110B, waveforms 310A and 310B are no longer in sync. Considerable timing skew has resulted from the differing effective dielectric constant experience by waveforms 310A and 310B propagating along the length of conductor traces 110A and 110B. This timing skew is one form of common-mode noise that increases with increasing lengths of conductor traces 110A and 110B.

This form of timing skew can limit the lengths of conductor traces 110A and 110B and/or the bandwidth of conductor traces 110A and 110B. If reception of waveforms 310A and 310B is time critical (e.g., must be received concurrently), then the example illustrated in FIG. 3 may result in an erroneous output by receiver 330. Differential impedance pairs are particularly sensitive to timing skew. For example, if waveforms 310A and 310B are a differential pair and receiver 330 is an operational amplifier configured to reject common-mode noise and pass a differential signal, the timing skew would adversely affect the differential comparison of waveforms 310A and 310B at time $t_2$. Thus, timing skew defeats the common-mode noise suppression characteristic of a differential impedance pair.

FIGS. 4 and 5 are top views illustrating conductor traces 410A and 410B on a circuit board 500 having a resin 430 reinforced by a fabric 440. In this embodiment, fabric 440 includes x-axis yarns 420A having a weave pitch E and y-axis yarns 420B having a weave pitch D. In the illustrated embodiment, conductor traces 410A and 410B have a center-to-center separation distance F (i.e., conductor trace pitch) matching weave pitch D, in accordance with the teachings of the present invention.

In one embodiment, solder mask 520 overlays conductor traces 410A and 410B. In one embodiment, a ground plane 510 resides under fabric 440. In one embodiment, conductor traces 410A and 410B and conductor plane 510 include copper metal for conduction of electrical signals. In one embodiment, circuit board 500 is a printed circuit board ("PCB"). It should be appreciated that other layers of circuit board 500 may reside above or below those illustrated in FIG. 5, but have been excluded for the sake of clarity. Additionally, the relative size, shape and distances between the various elements of this embodiment of circuit board 500 are in some instances exaggerated for clarity and are not necessarily shown to scale.

Center-to-center separation distance F of conductor traces 410A and 410B is matched to weave pitch D when center-to-center separation distance F is an integer multiple of weave pitch D (e.g., D, 2D, 3D . . . N×D). Similarly, a center-to-center separation distance of a pair of conductor traces running substantially parallel to the x-axis (not shown) is matched to weave pitch E when that center-to-center separation distance is an integer multiple of weave pitch E (e.g., E, 2E, 3E . . . N×E). Matching center-to-center separation distance F to weave pitch D ensures that conductor traces 410A and 410B have a substantially similar effective dielectric constant. In other words, signals propagating along conductor traces 410A and 410B will experience substantially similar effective dielectric constants.

Although the embodiment illustrated in FIGS. 4 and 5 depicts conductor traces 410A and 410B centered directly above adjacent yarns 420B, conductor traces 410A and 410B need not be so centered. In fact, the effective dielectric constant of conductor traces 410A and 410B will remain substantially similar whether or not conductor traces 410A and 410B, running parallel to the y-axis, are centered over adjacent yarns 420B, are centered between adjacent yarns 420B, or are centered somewhere in between. Matching center-to-center separation distance F to an integer multiple of weave pitch D ensures a similar effective dielectric constant. This is because the electromagnetic field created by a signal propagating down conductor traces 410A will interact with a similar volume ratio of epoxy resin 430 to yarns 420A and 420B as a signal propagating down conductor trace 410B. Matching weave pitch D helps to ensure that conductor trace 410A passes over an area of circuit board 500 having a ratio of areas above yarns 420A and 420B to areas above resin 430, which are between yarns 420A and 420B, equal to a similar ratio of areas passed over by conductor trace 410B. Constraining the paths of conductor traces 410A and 410B in this manner helps to ensure similar effective dielectric constants.

Thus, whether running a pair of conductor traces parallel to the y-axis or the x-axis, as long as center-to-center separation distance F is matched to weave pitch F or weave pitch E, respectively, the absolute placement of conductor traces 410A and 410B over fabric 440 is immaterial. This characteristic according to teachings of the present invention accommodates for inconsistencies in the fabrication of PCBs. Fabrication inconsistencies often result during a layout process of etching a design image generated by a computer aided design ("CAD") tool onto a blank PCB. Known technologies are unable to track yarns 420A and 420B within circuit board 500. As such, layout images cannot be registered to yarns 420A and 420B to ensure placement of conductor traces 410A and 410B directly above yarns 420B (or 420A when running parallel to x-axis). Matching center-to-center separation distance F to an integer multiple of weave pitch D eliminates the need to track the absolute position of yarns 420B (or yarns 420A). Rather, blank PCBs need only be aligned such that yarns 420A and yarns 420B are parallel to the x-axis and the y-axis, respectively.

The present invention is not limited to use with differential impedance pairs. Rather, embodiments may be used in connection with system buses, data buses, control buses, address buses, or the like. Anytime time propagation of two or more signals along two or more conductor traces is time critical, embodiments of the present invention may be used to reduce timing skew between the two or more conductor traces.

However, when using the present invention in connection with differential impedance pairs, common-mode cross-talk noise may be reduced by reducing the center-to-center separation distance F of conductor traces 410A and 410B. Reducing center-to-center separation distance F helps to ensure strong electromagnetic coupling between conductor traces 410A and 410B and therein high common-mode noise rejection. One method to reduce center-to-center separation distance F is to select a glass fabric having a narrow weave pitch and match center-to-center separation distance F to the first order multiple of this narrow weave pitch, as shown in FIGS. 4 and 5.

Figure 6:
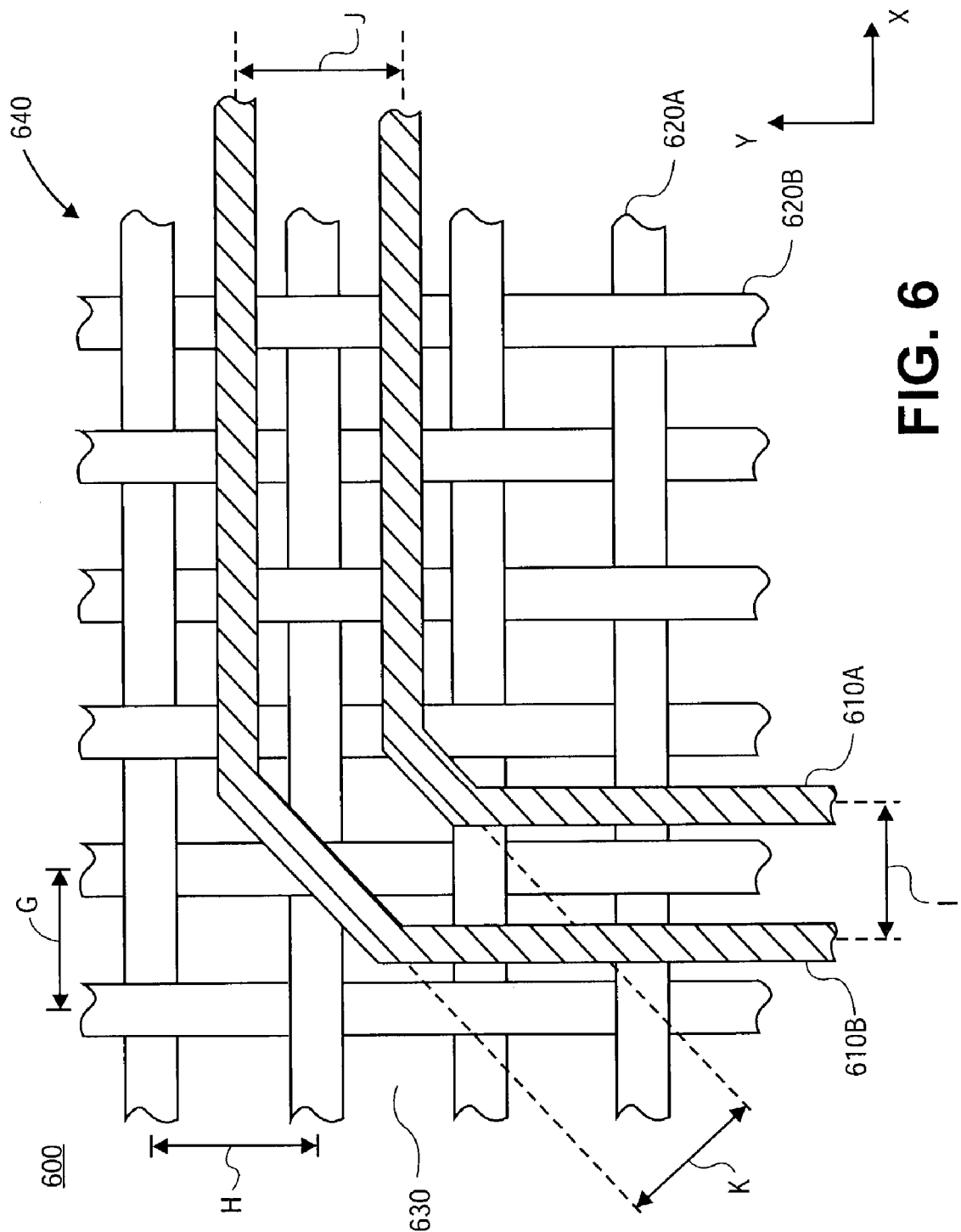
FIG. 6 is a top view illustrating a pair of conductor traces on a circuit board having center-to-center separation distances matching a weave pitch of x-axis yarns and a weave pitch of y-axis yarns in the circuit board, in accordance with an embodiment of the present invention.

FIG. 6 is a top view illustration of conductor traces 610A and 610B on a circuit board 600 having a resin 630 reinforced by a fabric 640. In this embodiment, fabric 640 includes y-axis yarns 620B having a weave pitch G and x-axis yarns 620A having a weave pitch H. In the illustrated embodiment, weave pitch H is greater than weave pitch G. In other embodiments, weave pitch G may be larger than weave pitch H or the two may be identical.

In the illustrated embodiment of FIG. 6, conductor traces 610A and 610B run parallel to the y-axis, then turn to run obliquely to both the x-and y axes, and then turn once again to run parallel to the x-axis. While running parallel to the y-axis, conductor traces 610A and 610B are separated by a center-to-center separation distance I. While running obliquely to the x and y axes, conductor traces 610A and 610B are separated by a center-to-center separation distance K. While running parallel to the x-axis, conductor traces 610A and 610B are separated by a center-to-center separation distance J.

Timing skew between conductor traces 610A and 610B can be reduced by appropriately matching center-to-center separation distances I, J, and K to weave pitches H and G of fabric 640. In one embodiment, while running parallel to the y-axis, center-to-center separation distance I is an integer multiple of weave pitch G. In one embodiment, while running parallel to the x-axis, center-to-center separation distance J is an integer multiple of weave pitch H. In one embodiment, while running obliquely to the x and y axes, center-to-center separation distance K is an integer multiple of weave pitch G. In an alternative embodiment, while running obliquely to the x and y axes, center-to-center separation distance K is an integer multiple of weave pitch H. In yet another embodiment, while running obliquely to the x and y axes, center-to-center separation distance K is an average of integer multiples of weave pitches G and H, following the relation:

$$K = \frac{N}{2} \times (G + H) \qquad \text{(Relation 1)}$$

where N represents an integer multiple. FIG. 6 further illustrates that centering conductor traces 610A and 610B over yarns 620A and/or 620B is not necessary.

Figure 7:
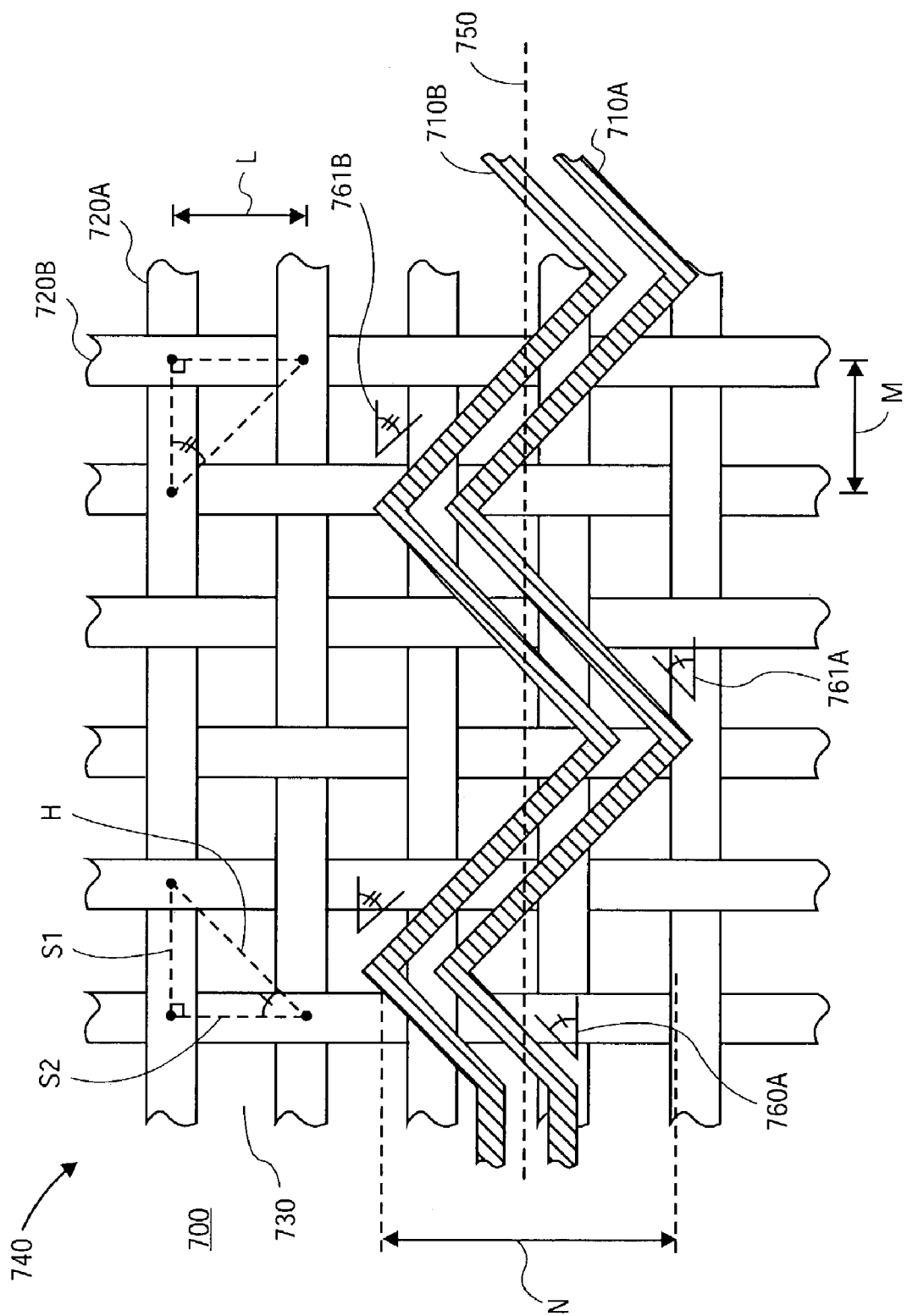
FIG. 7 is a top view illustrating a pair of conductor traces on a circuit board having paths "zigzagging" about an axis, in accordance with an embodiment of the present invention.

FIG. 7 is a top view illustration of conductor traces 710A and 710B on a circuit board 700 having a resin 730 reinforced by a fabric 740. In this embodiment, fabric 740 includes x-axis yarns 720A having a weave pitch L and y-axis yarns 720B having a weave pitch M.

In one embodiment, conductor traces 710A and 710B are routed along substantially parallel paths that "zigzag" about an axis 750. In the illustrated embodiment, axis 750 is parallel to yarns 720A. In an alternative embodiment, axis 750 is parallel to yarns 720B. Zigzagging the path of conductor traces 710A and 710B over circuit board 700 produces the effect of averaging out localized variations in the dielectric constant of circuit board 700 (e.g., differing dielectric constants of yarns 720A and 720B and resin 730). By zigzagging the paths of conductor traces 710A and 710B over fabric 740, each of conductor traces 710A and 710B pass over approximately equal areas of yarns 720A and 720B and resin 730. Thus, the effective dielectric constants of conductor traces 710A and 710B average out to a substantially similar value.

Additionally, conductor traces 710A and 710B may be formed on circuit board 700 having a center-to-center separation distance without regard to weave pitches L or M. Thus, this zigzag embodiment is attractive to a designer of circuit board 700 when weave pitches L and M are undetermined or unknowable to the designer at the time of design synthesis. Furthermore, this zigzag embodiment gives the designer the freedom to place conductor traces 710A and 710B closely together, despite a wide weave pitch, to maximize electromagnetic coupling between conductor traces 710A and 710B. Maximizing electromagnetic coupling beneficially maximizes common-mode noise rejection in a differential impedance pair.

In one embodiment, the paths of conductor traces 710A and 710B zigzag with a peak-to-peak amplitude N equal to or greater than a minimum value to adequately average out localized variations in the dielectric constant of circuit board 700. Peak-to-peak amplitude N is measured from a center of conductor trace 710A to a center of conductor trace 710B. In the illustrated embodiment, the paths of conductor traces 710A and 710B zigzag about axis 750, which is parallel to yarns 720A. Thus, in the illustrated embodiment, the minimum value of peak-to-peak amplitude N is weave pitch L. In an embodiment where axis 750 is substantially parallel to yarns 720B, the minimum value of peak-to-peak amplitude N is weave pitch M. Extending the overall path lengths of conductor traces 710A and 710B increase this averaging effect of the zigzag paths, thereby decreasing the deviation between the effective dielectric constants of conductor traces 710A and 710B. Matching the effective dielectric constants of conductor traces 710A and 710B reduces time skew between signals propagating along conductor traces 710A and 710B, as described above.

Angles 760A, 760B, 761A, and 761B represent angles formed between conductor traces 710A and 710B and yarns 720A (or yarns 720B if conductor traces 710A and 710B were to oscillate about an axis parallel to yarns 720B). In one embodiment, angles 760A, 760B, 761A, and 761B are similar angles. In one embodiment, angles 760A, 760B, 761A, and 761B are all dissimilar angles. In other embodiments, various combinations of angles 760A, 760B, 761A, and 761B are similar and/or dissimilar. However, there are particular angles that are optimal for balancing the effective dielectric constants of conductor traces 710A and 710B. In one embodiment, angles 760A, 760B, 761A, and 761B are optimal if the paths of conductor traces 710A and 710B run parallel to a hypotenuse H of a triangle having right angle sides S1 and S2 equal to weave pitch M and weave pitch L, respectively. Thus, in one embodiment where weave pitch M and weave pitch L are equivalent, angles 760A, 760B, 761A, and 761B all equal 45 degrees ±5 degrees for variations in manufacturing and layout.

Figure 8:
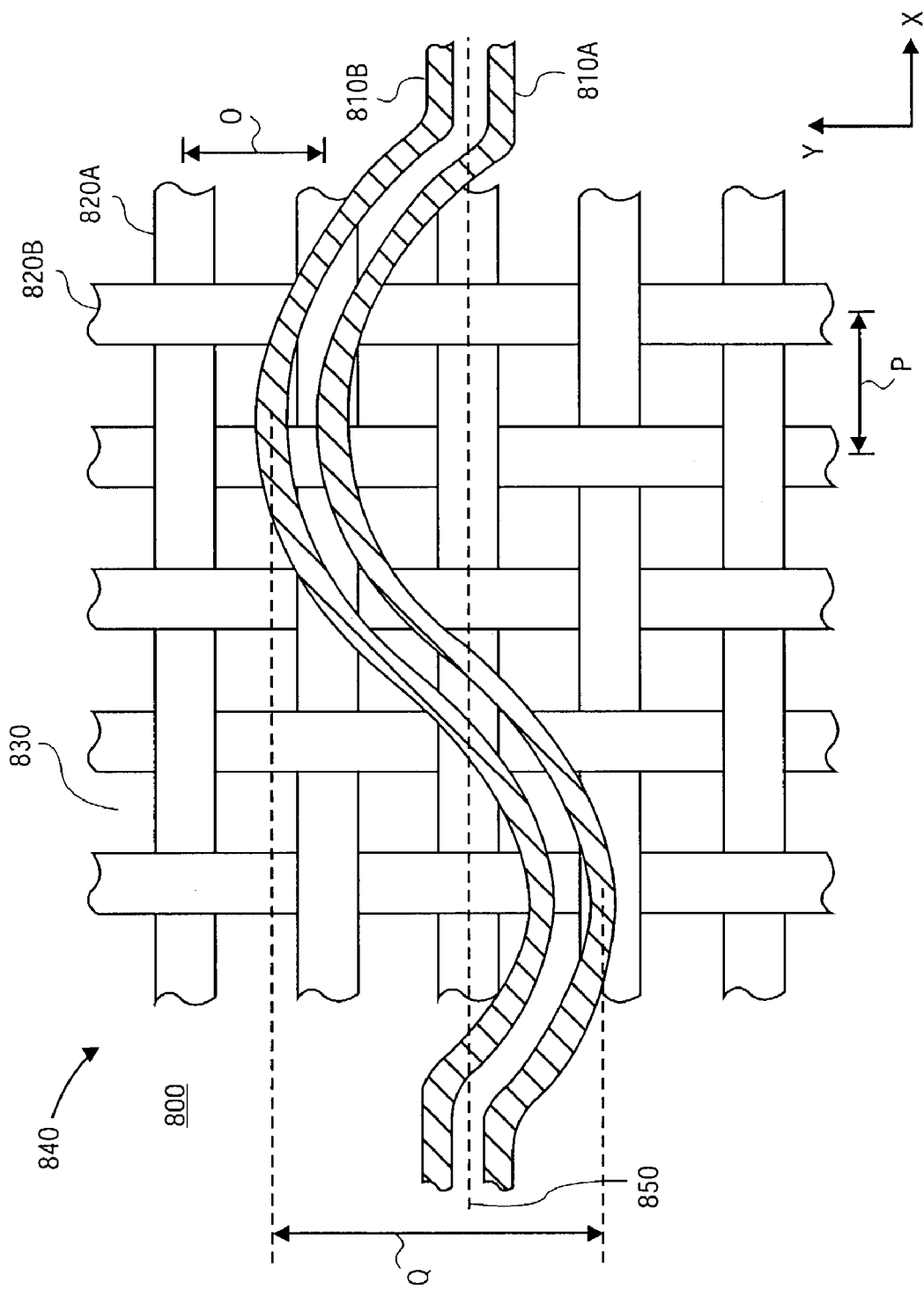
FIG. 8 is a top view illustrating a pair of conductor traces on a circuit board having paths oscillating about an axis in a "snake-like" manner, in accordance with an embodiment of the present invention.

FIG. 8 is a top view illustration of conductor traces 810A and 810B on a circuit board 800 having a resin 830 reinforced by a fabric 840. In this embodiment, fabric 840 includes x-axis yarns 820A having a weave pitch O and y-axis yarns 820B having a weave pitch P.

In one embodiment, conductor traces 810A and 810B oscillate about an axis 850 in a "snake-like" path. In the illustrated embodiment, axis 850 is parallel to yarns 820A. In an alternative embodiment, axis 850 is parallel to yarns 820B. Localized variations in the dielectric constant of circuit board 800 are averaged out, as in the zigzag embodiments, by oscillating the path of conductor traces 810A and 810B in the snake-like path. As with the zigzag embodiments, conductor traces 810A and 810B may be formed on circuit board 800 having a center-to-center separation distance without regard to weave pitches O and P. This gives a designer the freedom to place conductor traces 810A and 810B closely together, despite a wide weave pitch, to maximize electromagnetic coupling between conductor traces 810A and 810B. Maximizing electromagnetic coupling beneficially maximizes common-mode noise rejection in a differential impedance pair. Furthermore, extending the overall path lengths of conductor traces 810A and 810B increase the averaging effect of the snake-like paths, thereby decreasing the deviation between the effective dielectric constants of conductor traces 810A and 810B. Finally, this embodiment has the added benefit of reducing parasitic capacitances that may result due to sharp corners in conductor traces 710A and 710B.

In one embodiment, a peak-to-peak amplitude Q of the paths of conductor traces 810A and 810B is equal to or greater than a minimum value to adequately average out localized variations in the dielectric constant of circuit board 800. In the illustrated embodiment, the paths of conductor traces 810A and 810B are oscillating about axis 850, which is parallel to yarns 820A. Thus, in the illustrated embodiment, the minimum value of peak-to-peak amplitude Q is weave pitch O. Peak-to-peak amplitude Q is measured within one cycle of an oscillation from the center of conductor trace 810A at the bottom of the oscillation valley, to the center of conductor trace 810B at the top of the oscillation peak (i.e., peak-to-peak of the oscillation paths measured from center-to-center of conductor traces 810A and 810B). It should be appreciated that each oscillation cycle about axis 850 of the paths may have varying peak-to-peak amplitudes Q and varying periodicity (or radius of curvature).

It is appreciated of course, that although only two conductor traces 710A and 710B or two conductor traces 810A and 810B are illustrated in FIGS. 7 and 8, any number of conductor traces may be implemented using the above described techniques to reduce timing skew between all the conductor traces. For example, a system bus, a data bus, a control bus, an address bus, and the like could be implemented using the teachings described above.

Figure 9:
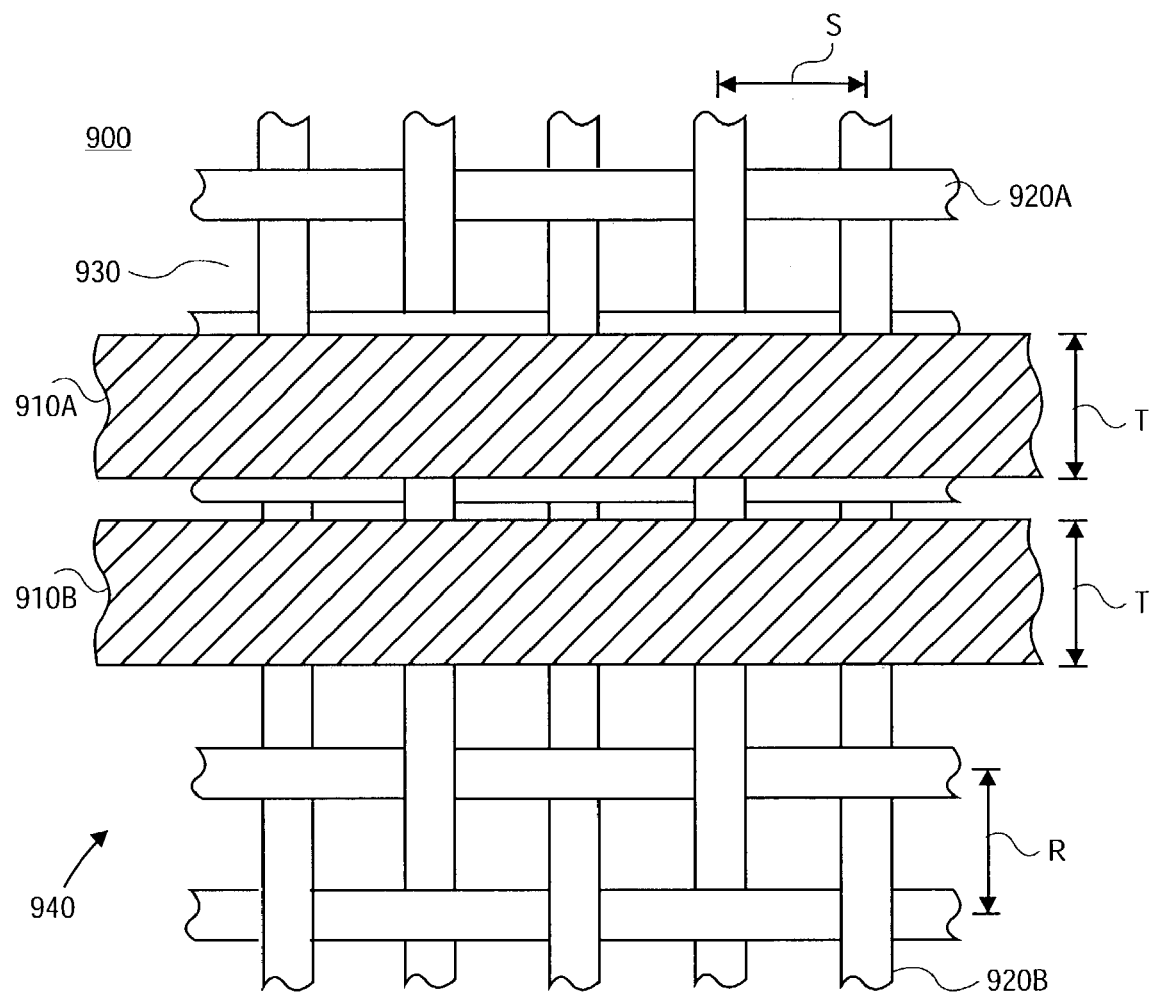
FIG. 9 is a top view illustrating a pair of conductor traces on a circuit board having widths equal to an integer multiple of a weave pitch separating adjacent yarns in the circuit board, in accordance with an embodiment of the present invention.

FIG. 9 is a top view illustration of conductor traces 910A and 910B on a circuit board 900 having resin 930 reinforced by a fabric 940. In this embodiment, fabric 940 includes x-axis yarns 920A having a weave pitch R and y-axis yarns 920B having a weave pitch S.

In the illustrated embodiment, widths T of conductor traces 910A and 910B are integer multiples of weave pitch R. In one embodiment, when conductor traces 910A and 910B are running parallel with yarns 920B, widths T of conductor traces 910A and 910B are an integer multiple of weave pitch S. By constraining widths T to an integer multiple of weave pitch R (or weave pitch S when running parallel to yarns 920B) each conductor traces 910A and 910B passes over approximately equal areas of yarns 920A and 920B and resin 730. In so doing, the effective dielectric constants of conductor traces 920A and 920B average out to a substantially similar value. Thus, timing skew is reduced between conductor traces 920A and 920B.

Furthermore, by constraining widths T to an integer multiple of weave pitch R (or weave pitch S when running parallel to yarns 920B) a center-to-center separation distance between conductor traces 910A and 910B need not depend on weave pitch R (weave pitch S when running parallel to yarns 920B). Thus, the designer of circuit board 900 is free to run conductor traces 910A and 910B as close as desired to maximize electromagnetic coupling without sacrificing consistency between their effective dielectric constants.

It is appreciated of course that the relative size, shape and distances between the various components of this embodiment are in some instances exaggerated for clarity and are not necessarily shown to scale. Furthermore, although FIG. 9 illustrates only two conductor traces 910A and 910B running side-by-side, any number of conductor traces may be implemented in practice using the above described technique to reduce timing skew between all the conductor traces.

Figure 10B:
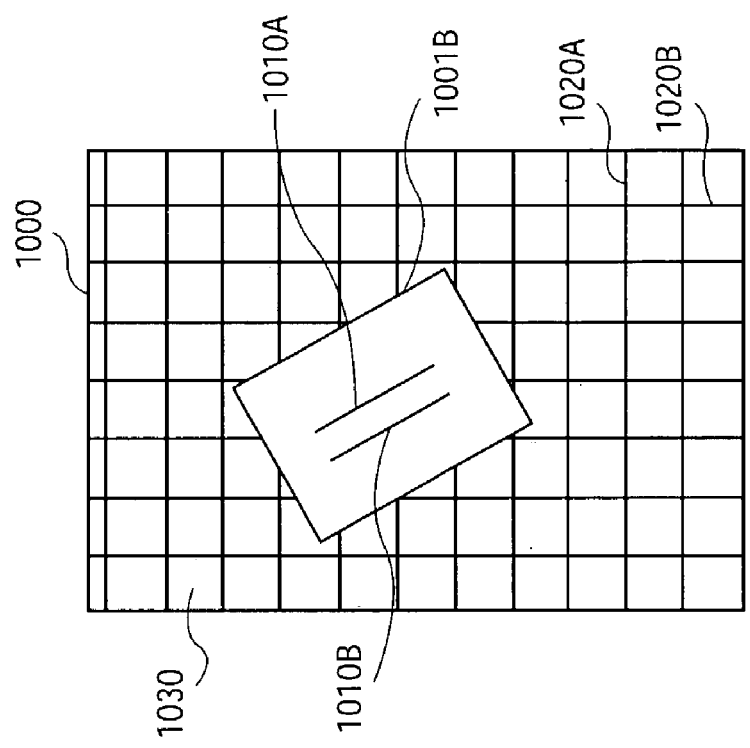
FIG. 10B is a top view illustrating a rotated layout design having a pair of conducting traces superimposed on a circuit board, in accordance with the present invention.
Figure 10A:
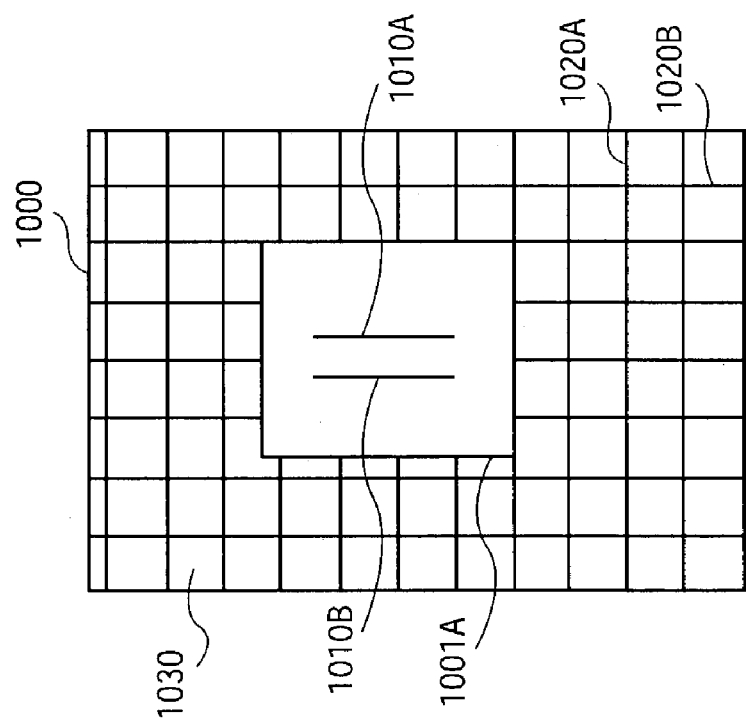
FIG. 10A is a top view illustrating a layout design having a pair of conducting traces superimposed on a circuit board, in accordance with the present invention.

FIGS. 10A and 10B are top view illustrations of layout designs 1001A and 1001B superimposed on a circuit board 1000. In this embodiment, circuit board 1000 includes a resin 1030 reinforced by x-axis yarns 1020A and y-axis yarns 1020B.

FIG. 10A illustrates layout design 1001A including conductor traces 1010A and 1010B running parallel to yarns 1020B. In another embodiment, layout design 1001A includes conductor traces 1010A and 1010B running parallel to yarns 1020A. To reduce timing skew between conductor traces 1010A and 1010B in layout design 1001A, one of the above embodiments should be implemented in accordance with the present invention.

However, FIG. 10B illustrates layout design 1001B having conductor traces 1010A and 1010B aligned oblique to yarns 1020A and 1020B. In one embodiment, layout design 1001B is obtained by rotating layout design 1001A prior to etching layout design 1001B onto circuit board 1000. In one embodiment, layout design 1001B is obtained by rotating circuit board 1000 prior to etching layout design 1001B onto circuit board 1000.

Typical layout designs have a majority of conductor traces running substantially parallel to either the x or y axes and are formed on a circuit board having yarns running parallel to the x or y axes. Thus, when layout design 1001A is rotated obliquely to the x and y axes (or circuit board 1000 is rotated), an overwhelming majority of conductor traces in layout design 1001B end up running obliquely to yarns 1020A and 1020B. In one embodiment, layout design 1001B is rotated by 22.5 degrees in either the clockwise or counterclockwise direction. Positioning layout design 1001B obliquely to yarns 1020A and 1020B produces a net effect of averaging localized variations in the dielectric constant of circuit board 1000, in the manner described above in connection with the zigzag embodiment.

It is appreciated of course that the materials and dimensions, utilized in the embodiments described above are provided for explanation purposes and that other materials and dimensions may be utilized in accordance with the teachings of the present invention. Furthermore, the relative size, shape and distances between the various components of the above embodiments are in some instances exaggerated for clarity and are not necessarily shown to scale. For instances, the relative sizes of the conductor traces and the yarns are not necessarily shown to scale.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A method for reducing timing skew, comprising:
   propagating a first signal along a first conductor trace, the first conductor trace formed on a dielectric medium having a resin reinforced with a fabric having a first plurality of yarns running parallel to a first axis separated by a first weave pitch and a second plurality of yarns running parallel to a second axis separated by a second weave pitch; and
   propagating a second signal along a second conductor trace formed on the dielectric medium, the second conductor trace positioned on the dielectric medium such that the first and second signals experience substantially similar effective dielectric constants.

2. The method of claim 1 wherein the first and second conductor traces are further positioned on the dielectric medium such that the first and second conductor traces each pass over areas of the dielectric medium having substantially equal ratios of areas above the first and second plurality of yarns to areas above the resin between the first and second plurality of yarns.

3. The method of claim 1 wherein the first and second conductor traces have a center-to-center separation distance equal to an integer multiple of the first weave pitch when the conductor traces run substantially parallel to the first axis.

4. The method of claim 1 wherein the first conductor trace is routed along a first path and the second conductor trace is routed along a second path running substantially parallel to the first path, the first and second paths zigzagging about a line running parallel to the first axis, the first and second paths zigzagging with a peak-to-peak amplitude equal to or greater than the first weave pitch as measured from a center of the first path to a center of the second path.

5. The method of claim 4 wherein the first and second zigzagging paths run at an angle of approximately 45 degrees ±5 degrees to the first axis when the first weave pitch is substantially similar to the second weave pitch.

6. The method of claim 4 wherein the first and second zigzag paths run substantially parallel with a hypotenuse of a triangle having a first right angle side equal to the first weave pitch and a second right angle side equal to the second weave pitch.

7. The method of claim 1 wherein the first conductor trace is routed along a first path and the second conductor trace is routed along a second path running substantially parallel to the first path, the first and second paths oscillating about a line running parallel to the first axis in a snake-like manner, the first and second paths oscillating with a peak-to-peak amplitude equal to or greater than the first weave pitch as measured from a center of the first path to a center of the second path.

8. The method of claim 1 wherein the first and second conductor traces each have a first width equal to an integer multiple of the first weave pitch when running substantially parallel to the first axis.

9. The method of claim 8 wherein the first and second conductor traces each having a second width equal to an integer multiple of the second weave pitch when running substantially parallel to the second axis.

10. The method of claim 1 wherein a layout design including the first and second conductor traces is rotated obliquely to the first and second axes prior to forming the first and second conductor traces on the dielectric medium.

11. The method of claim 10 wherein the layout design is rotated by approximately 22.5 degrees.

12. The method of claim 1 wherein the dielectric medium is rotated such that the first and second axes are oblique to the first and second conductor traces prior to forming the first and second conductor traces on the dielectric medium.

13. The method of claim 12 wherein the dielectric medium is rotated by approximately 22.5 degrees.

14. The method of claim 1 wherein the first and second conductor traces comprises a differential impedance pair.

15. The method of claim 1 wherein the dielectric medium comprises a printed circuit board, wherein the first and second plurality of yarns comprise pluralities of glass fiber bundles, and wherein the first and second conductor traces comprise copper conductor traces.

16. An apparatus, comprising:
a composite dielectric medium having a resin reinforced with a fabric, the fabric having a first plurality of yarns running parallel to a first axis separated by a first weave pitch and a second plurality of yarns running parallel to a second axis separated by a second weave pitch;
a first conductor trace formed on the composite dielectric medium; and
a second conductor trace formed on the composite dielectric medium, the second conductor trace positioned on the composite dielectric medium such that the first and second conductor traces have substantially similar effective dielectric constants.

17. The apparatus of claim 16 wherein the first and second conductor traces are further positioned on the composite dielectric medium such that the first and second conductor traces pass over areas of the composite dielectric medium having substantially equal ratios of areas above the first and second plurality of yarns to areas above the resin between the first and second plurality of yarns.

18. The apparatus of claim 16 wherein the first conductor trace is routed along a first path and the second conductor trace is routed along a second path running substantially parallel to the first path, the first and second paths zigzagging about a line running parallel to the first axis, the first and second paths zigzagging with a peak-to-peak amplitude equal to or greater than the first weave pitch as measured from a center of the first path to a center of the second path.

19. The apparatus of claim 18 wherein the first and second paths run substantially parallel with a hypotenuse of a triangle having a first right angle side equal to the first weave pitch and a second right angle side equal to a second weave pitch.

20. The apparatus of claim 16 wherein the first conductor trace is routed along a first path and the second conductor trace is routed along a second path running substantially parallel to the first path, the first and second paths oscillating about a line running parallel to the first axis in a snake-like manner, the first and second paths oscillating with a peak-to-peak amplitude equal to or greater than the first weave pitch as measured from a center of the first path to a center of the second path.

21. The apparatus of claim 16 wherein the first and second conductor traces have a first width equal to an integer multiple of the first weave pitch when running substantially parallel to the first axis.

22. The apparatus of claim 21 wherein the first and second conductor traces have a second width equal to an integer multiple of the second weave pitch when running substantially parallel to the second axis.

23. The apparatus of claim 16 wherein the composite dielectric medium comprises a printed circuit board, wherein the first and second plurality of yarns comprise pluralities of glass fiber bundles, and wherein the first and second conductor traces comprise copper conductor traces.

* * * * *